United States Patent [19]

Akita et al.

[11] 4,144,403

[45] Mar. 13, 1979

[54] MOUNTING ASSEMBLY FOR ELECTRIC CIRCUIT MEMBER

[75] Inventors: Sigeyuki Akita, Aichi; Junji Kitagawa, Okazaki, both of Japan

[73] Assignee: Nippon Soken, Inc., Nishio, Japan

[21] Appl. No.: 702,629

[22] Filed: Jul. 6, 1976

[30] Foreign Application Priority Data

Jul. 8, 1975 [JP] Japan ............................ 50-95442[U]
Sep. 16, 1975 [JP] Japan ............................ 50-127231[U]

[51] Int. Cl.$^2$ .............................................. H05K 5/00

[52] U.S. Cl. .............................. 174/52 R; 174/65 R; 73/313; 73/362 AR; 338/28

[58] Field of Search ............ 174/52 R, 65 R; 338/28, 338/29, 30; 73/362 R, 362 AR, 398 R, 398 AR, 301, 313; 339/268 R

[56] References Cited

U.S. PATENT DOCUMENTS

| | | | |
|---|---|---|---|
| 1,414,298 | 4/1922 | Montero | 73/313 X |
| 2,581,655 | 1/1952 | Harden | 339/268 R X |
| 2,685,021 | 7/1954 | Duncan | 339/268 R X |
| 3,044,296 | 7/1962 | Boddy | 73/313 X |
| 3,408,053 | 10/1968 | Vantroba | 73/313 X |
| 3,913,058 | 10/1975 | Nishio | 338/28 |

*Primary Examiner*—J. V. Truhe
*Assistant Examiner*—D. A. Tone
*Attorney, Agent, or Firm*—Cushman, Darby & Cushman

[57] ABSTRACT

An electric circuit member in a housing has lead wires which protrude out an end of the housing. A portion of the housing is provided with external threading for mounting and dismounting of the whole assembly. In order to prevent twisting of the wires as assembly is mounted and dismounted, the assembly may be manipulated to let the electric circuit member and its lead wires slip relative to the threaded housing portion. Three variations are shown.

10 Claims, 10 Drawing Figures

MOUNTING ASSEMBLY FOR ELECTRIC CIRCUIT MEMBER

BACKGROUND OF THE INVENTION

The present invention relates, in general, to a mounting assembly for releasably mounting an electric circuit element, and particularly, to a mounting assembly for connecting and disconnecting an electric circuit element relative to an article free from fear that the lead wires which extend from the electric circuit element will be twisted during the connecting and disconnecting operation.

In mounting a conventional electric circuit element including a housing and an electric circuit member such as a detecting device for chemical and/or physical analytical use, the electric circuit member is fixedly mounted within a housing. FIG. 1 shows an example of a conventional construction of such electric circuit element. Referring to FIG. 1, there are shown a housing 11 having a threaded portion 11*a* at its outer circumference, an electric circuit board 12 which is, for instance, of a type with a detecting circuit printed on a base plate, a screw 13 for securing the electric circuit board 12 onto the housing 11, lead wires 14 from the electric circuit board 12 for picking up electric signals from the electric circuit board 12 and for supplying the circuit board 12 with electricity, an outlet opening with an insulating bushing 15 for passing the lead wires therethrough, and a signal indicator 16 adapted to indicate by electric signals from the circuit member 12 or an electric computer element for logic operations. In this example, the electric circuit board 12 and the housing 11 are secured together by using appropriate means such as a screw 13 or an adhesive (not shown. When threadably connecting or disconnecting a detecting element or detector assembly 21 including the above mentioned circuit board 12 through a threaded hole provided in a cover plate 20 of a structure to be mounted with this detecting assembly as shown in FIG. 2, it is generally required to manually turn the detector assembly 21 with respect to the cover plate 20 in the directions shown by arrows 22 in FIG. 1.

During such connecting or disconnecting work, the housing 11 of the electric element 21 is caused to be manually rotated, thus resulting in an inevitable rotating motion of the electric circuit board 12 fixedly mounted thereon. Consequently, the lead wires 14 connected to the circuit board 12 are caused to be rotated or twisted in correspondence with a rotating motion of the above-mentioned housing 11. From each construction, there is a possibility of disconnection or short circuiting of the lead wires 14 due to breakage of the insulating material of the wires 14.

The present invention is essentially directed toward elimination of such drawbacks stated above as encountered in the conventional device.

SUMMARY OF THE INVENTION

It is therefore a primary object of the present invention to provide an improved mounting assembly for an electric circuit element wherein any possible twisting of the lead wires can effectively be prevented from occurring during the work of mounting or dismounting such electric circuit element to and from a member to which such element is to be mounted and dismounted.

It is another object of the invention to provide an improved mounting assembly for an electric circuit element whereby an electric circuit element can easily yet assuredly be connected and disconnected into and out of a structure for mounting and dismounting such element without the lead wires thereof being turned or twisted during such connecting and disconnecting work.

According to the present invention, briefly summarized by way of perferred embodiments thereof, for attaining those objects as well as other objects and advantages, there is provided an improved mounting assembly which includes an electric circuit member disposed in a housing and which has lead wires which protrude out an end of the housing. A portion of the housing is provided with external threading for mounting and dismounting of the whole assembly. In order to prevent twisting of the wires as the assembly is mounted and dismounted, the assembly may be manipulated to let the electric circuit member and its lead wires slip relative to the threaded housing portion.

BRIEF DESCRIPTION OF THE SEVERAL VIEWS OF THE DRAWING

The construction, principle, and details of the present invention, as well as further advantages thereof, will become more apparent from the following detailed description with respect to the preferred embodiments of the present invention, when read in conjunction with the accompanying drawings.

In the drawings.

DETAILED DESCRIPTION

Description will now be given in detail on a preferred embodiment of a mounting assembly for use in mounting an electric circuit element according to the present invention by referring to the accompanying drawings..

Figure 3:
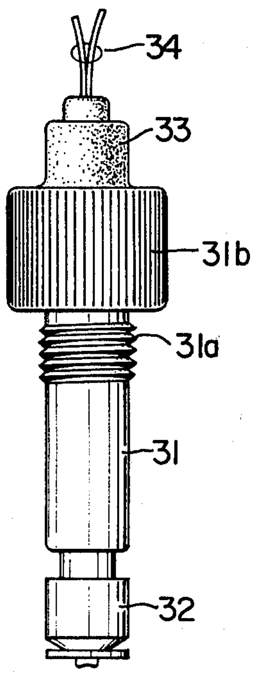
FIG. 3 is an elevational view showing the exterior of a first embodiment of the mounting assembly according to this invention.
Figure 4:
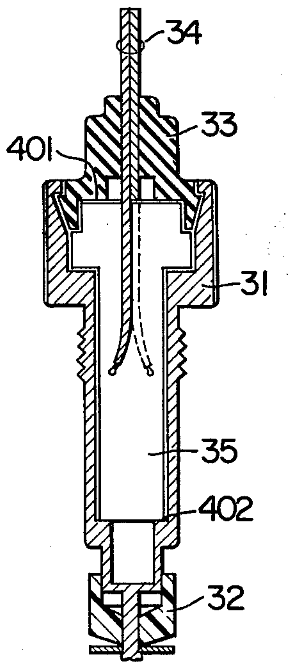
FIG. 4 is a longitudinal sectional view, showing the interior construction of the mounting assembly of this invention shown in FIG. 3.

Referring to FIGS. 3 and 4, there is shown a first embodiment of the present invention.

In FIG. 3, there is shown an elevational view showing the exterior of a mounting assembly of the invention for use in a detector assembly for detecting the quanity or liquid level and specific gravity of an electrolyte for an electric battery. In this Figure, there is shown a housing 31 constituting an outside fixing member of the mounting assembly, the housing 31 being provided at its outer periphery with a threaded portion 31*a* adapted to threadedly connect the mounting assembly onto a structure for mounting the detector assembly thereon, and also provided with a knurled portion 31*b* for preventing possible slipping when manually turning the mounting assembly. Also shown are a float 32 adapted to move with buoyancy upwardly or downwardly according to a change in the quantity or liquid level and specific gravity of the electrolyte of an electric battery, a rubber cap 33 with a resilient property, adapted to fix the electric circuit board to the housing, and a pair of lead wires 34. FIG. 4 is an elevational view, in vertical section, showing the interior construction of the detector assembly, in which like parts are designated by like reference numerals. In FIG. 4, there is shown an electric circuit member 35 which has an electric detecting circuit printed on a base plate, which is placed in mechanical contact with the rubber cap 33 at a shoulder surface 401 on one hand and with the housing 31 at a shoulder surface 402 on the other hand.

Figure 5:
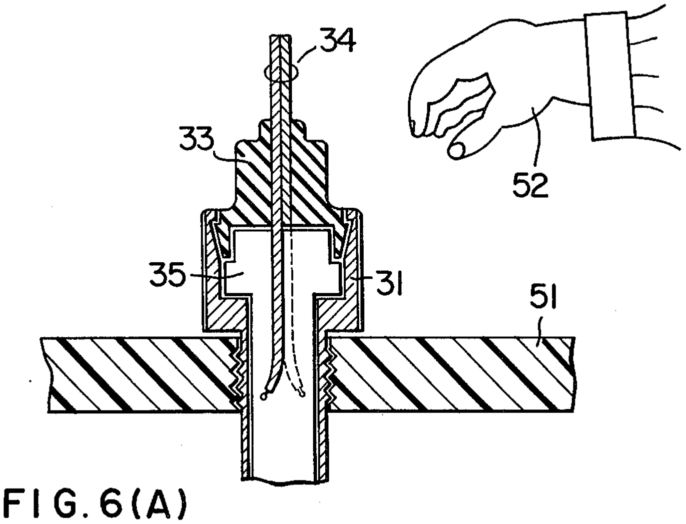
FIG. 5 is a fragmentary longitudinal sectional view, showing for explanatory purpose the interior mounting relationship of the mounting assembly of this invention.

Description is now given of the operation of the mounting assembly of the construction mentioned above, wherein a mounting assembly of this invention including therein a detector assembly which is installed on a mount on a cover plate 51 of an electric battery as shown in FIG. 5. When dismantling the mounting assembly from the mount on the cover plate, the rubber cap 33 is first held by one hand 52, so as not to permit its rotation, while the housing 31 is manually rotated by the other hand. As best seen in FIG. 4, considering that both of the two shoulder surfaces 401 and 402 are disposed between the electric circuit 35 and other parts, and the shoulder surface 401 is in contact with a cap made of a resilient material such as rubber, it is apparent that the shoulder surface 401 encounters much greater friction force than that at the shoulder surface 402. For this reason, even though the housing 31 is caused to be rotated manually, the circuit member 35 is prevented from such rotating motion. In other words, it is practical to remove or dismantle the detector assembly from its mount leaving the lead wires 34 free from any distortion or twisting during this dismantling operation. Likewise, this is also true with the case of installing the detector assembly onto its mount.

Figure 6A:
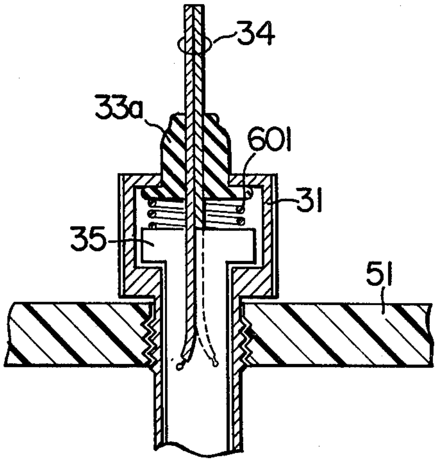
FIG. 6(A) and FIG. 6(B) are views, showing for explanatory purposes the interior mounting relationship of a second embodiment of this invention.
Figure 6B:
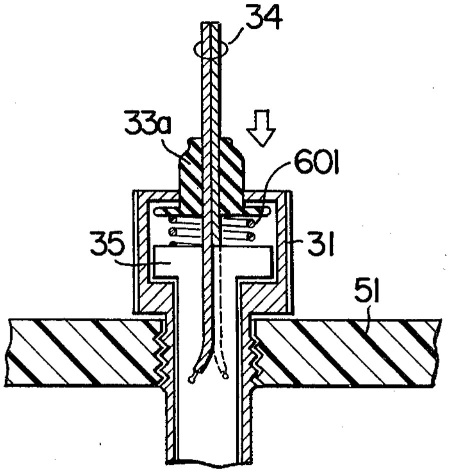

Referring now to FIGS. 6(A) and (B), there is shown another embodiment of this invention. In this embodiment, there are provided a rigid cap and resilient means such as a coil spring which function, as a resilient member in place of the rubber cap as illustrated in FIGS. 3 and 4. In FIG. 6(A), the electric circuit member 35 is fixedly disposed between the housing 31 and the cap 33*a* by use of a coil spring 601. When dismantling the detector assembly from its mount, firstly the cap 33*a* is manually pushed in the direction as shown by an arrow in FIG. 6(B), thus relieving the frictional force acting between the cap 33*a* and the housing 31, and therefore, preventing the cap 33*a* from being rotated in correspondence with the rotation of the housing 31 when it is manually rotated. Consequently, the electric circuit 35 is prevented from being rotated as it is held by the spring 601, thus assuring that the lead wires 34 are not twisted during the work of dismantling the detector assembly from its mount.

According to the embodiments of the present invention as described hereinbefore, there is provided an improved arrangement wherein there is interposed a resilient means such as a rubber cap, or combination of a rigid cap and a coil spring between the electric circuit and the housing, whereby in a detector assembly including an electric circuit, the electric circuit member is fixedly mounted by the resilient member. When installing and dismantling this detector assembly on and from its mount, only the housing or the outside fixing member of the assembly is manually rotated while leaving the electric circuit member unturned. With such construction, there is produced an advantageous feature that the lead wires are assuredly prevented from disconnection and/or short circuiting due to breakage of the insulating material therearound usually caused in conventional mounting assemblies by twisting of the lead wires during installation and dismantling work of the detector assembly onto and out of its mount. This advantage is attained by virtue of the construction such that the detector assembly can be installed and dismantled without any fear of twisting the lead wires.

Figure 7:
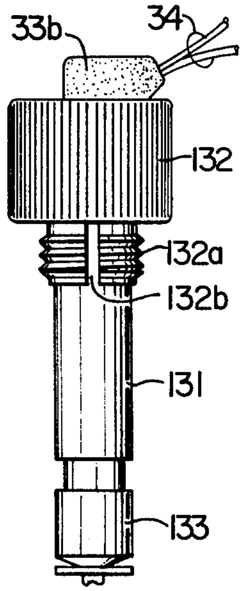
FIG. 7 is an elevational view showing the exterior of a third embodiment of the invention.
Figure 8:
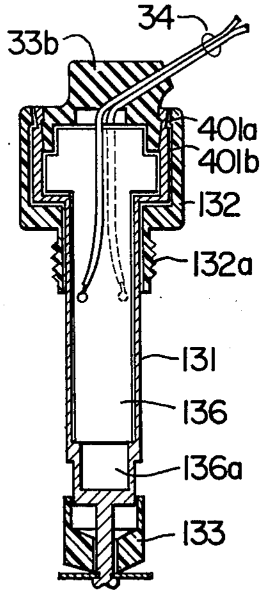
FIG. 8 is a longitudinal sectional view, showing the interior construction of the third embodiment of the mounting assembly shown in FIG. 7.
Figure 9:
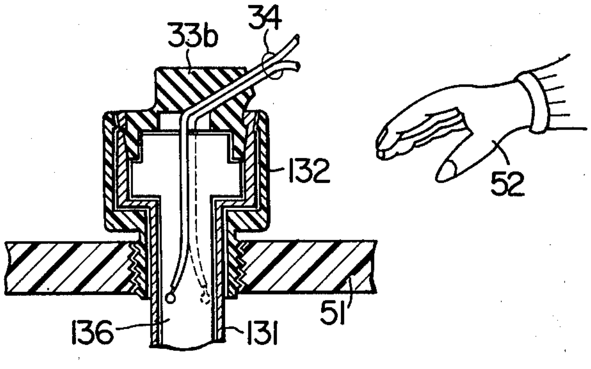
FIG. 9 is a fragmentary longitudinal sectional view, showing for explanatory purposes the interior mounting relationship of the mounting assembly shown in FIG. 7.

Referring now to FIGS. 7, 8 and 9, there is shown a third embodiment of the present invention.

FIG. 7 is an elevational view showing the exterior of a coupling device of this invention for use in a detector assembly which is designed for detecting the quantity or liquid level and the specific gravity of the electrolyte in an electric battery. In this Figure, there are shown a housing 131 comprising an electric circuit element, and a housing guide 132 constituted by an outside fixing member formed thereon with a knurled portion for preventing occasional slipping during a manual turning operation. The housing 131 is inserted with a loose fit into the housing guide 132 so that these members are freely movable with respect to each other. On the other hand, the housing guide 132 is provided with a threaded portion 132*a* for threaded connection to the mount on the battery, and also with a slit 132*b* so that the diameter of the housing guide may be slightly reduced at its threaded portion when the housing guide is screwed down into the threaded opening of the cover plate. Thus, the housing 131 may be positively held and tightly secured in the mounted position. Also shown is a float 133, which is adapted to move upwardly or downwardly with its buoyancy following the change in the liquid level and the specific gravity of the electrolyte of a battery. 33*b* is a rubber cap for securing the electric circuit part to the housing 131, and also for sealing the circuit part from the outside. There is shown a pair of lead wires 34. The housing 131, the float 133 and the like are generally made of a plastic of acid-resistant characteristic.

Figure 1:
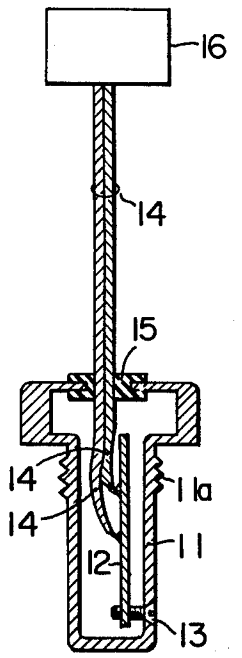
FIG. 1 PRIOR ART
FIG. 1 is a schematic view, partly in section, showing the interior construction of a detecting element including a conventional electric circuit member mounting assembly.
Figure 2:
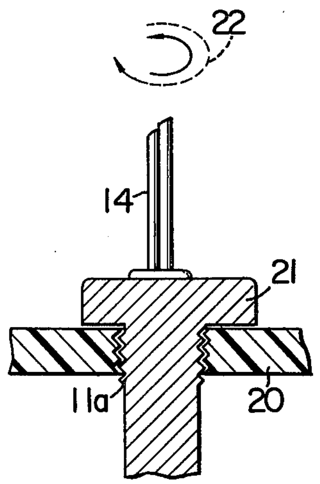
FIG. 2 PRIOR ART
FIG. 2 is a schematic view, partly in section showing, for explanatory purposes, operation of a conventional arrangement shown in FIG. 1.

FIG. 8 is a schematic view showing the interior construction of the detector assembly, in which there is shown a housing guide 132 made of a plastic or the like, having a construction such that the housing 131 is prevented from coming out of the housing guide 132 by means of a contact surface 401*b* having a shouldered portion 401*a* at the end of the inner circumference of the housing guide. When installing or dismantling the detector assembly onto or out if its mount, it is required to manually turn only the housing guide 132 on the contact surface 401*b*. Also shown is an electric circuit member 136 for detecting the travel of the above mentioned float 133, which circuit member is of a type wherein there is provided an electric circuit printed on a base plate, and which includes a sensor 136*a* comprising a coil or a reed switch, the detecting signal being input through the lead wires 34 to a signal processing station such as an electric computer 16 as illustrated in FIG. 1.

It should be noted, in the embodiment having the construction as illustrated in FIGS. 7 and 8, that the housing 131 and the electric circuit 136 provided within the housing 131 constitute the electric circuit element, and the housing guide 132 constitutes the outside fixing member. Consequently, when mounting and dismantling the above mentioned electric circuit element onto and out of its mount, the housing 131 which constitutes an essential component of the electric circuit element is not turned.

Description is now given of the operation of the third embodiment of this invention having the construction described above. As shown in FIG. 9, when the detector assembly is installed or dismantled on or from the cover plate 51 of a battery, firstly the housing 131 is held by gripping the rubber cap **33*b* with one hand, while manually rotating the housing guide 132 with the other hand. Then, since the housing guide 132 is caused to be held and fixedly secured by means of the above mentioned slit 132*b* shown in FIG. 7, the housing 131 is likely to rotate unless it is held by hand, however, when the housing is loosened to some extent, the constricted slit opening reverts to its original spacing thus releasing the tightening force with which the housing guide 132 holds the housing 131, and therefore, the housing guide 132 and the housing 131 are now movable freely relative to each other. Consequently, there exists no longer a mechanical connection between the housing guide 132 and the housing 131, thus leaving the housing 131 to be free from the rotating motion of the housing guide 132. In other words, the detector assembly can be removed from its mount with the lead wires 34** being free from twisting during the dismantling operation. It is also apparent that this is true with a mounting operation.

As fully described hereinbefore, in this third embodiment of this invention where the electric element of the detector assembly or the like comprises the lead wires, there is provided a meritorious effect such that the housing guide only can be manually rotated leaving the housing to be free from the rotating motion of the housing guide when installing and dismantling the electric element. This is owing to such duplex construction that the housing guide and the housing engage with each other with a loose fit unless tightened by the screw threads so that there is permitted smooth rotational movement between the two, thus preventing the lead wires stemming from the electric element from being twisted during the installation and dismantling operation, consequently there is no longer a risk of disconnection of the lead wires and/or short circuit due to breakage of the insulating material of the lead wires caused by twisting of such wires during installation and dismantling work of the assembly.

Although detailed description has been made exclusively on the foregoing typical embodiments of this invention, it should be understood that the preferred embodiments of the invention as described and shown herein do not mean in any way limitation of this invention to such embodiments, but on the contrary, many changes, variations and modifications with respect to the construction and arrangement in practice thereof can further be derived by those skilled in the art to which the present invention pertains, whereby the advantageous features of this invention may be realized without departing from the spirit and scope of the invention as set forth in the appended claims.

We claim:

1. An electric circuit member mounting assembly, comprising:
an electric circuit member having lead wires extending therefrom;
a housing having a cavity opening through one end thereof, the electric circuit member being received in said cavity and the lead wires extending out through said opening;
first surface means on the electric circuit member and the housing in the cavity thereof, where the electric circuit member and housing are in slidable engagement with one another;
a biasing means mounted on the housing;
second surface means on the electric circuit member and the biasing means;
the biasing means being displaceable between a first condition in which the biasing means is rotationally locked relative to the housing so that if the housing were rotated, the biasing means would rotate therewith, and a second condition in which the biasing means is rotationally released relative to the housing and the frictional force exerted by the biasing means on the electric circuit member at the second surface means is greater than the frictional force exerted between the electric circuit member and the housing at the first surface means, so that if the housing were rotated, and the biasing means held rotationally stationary, the electric circuit member will remain rotationally stationary relative to the biasing means.

2. The electric circuit member mounting assembly of claim 1, wherein:
the biasing means comprises a cap for the cavity, the lead wires traverse the cap in passing out of the cavity, the cap is sealed both against the lead wires and against the housing.

3. An assembly for mounting an electric circuit member having lead wires, in a threaded opening so that electric circuit member can be mounted and dismounted without twisting the lead wires, said assembly comprising:
a housing having an exteriorly threaded portion for threaded engagement in said threaded opening;
said housing having an internal cavity for receipt of the electric circuit member which cavity opens through an end of said housing for passing the lead wires of the electric circuit member out of the cavity;
a gasketing bushing mounted on the housing and capping said cavity for sealing between the lead wires and said end of the housing;
resilient biasing means on said bushing in the cavity for being resiliently compressively loaded to a first lower extent between the bushing and the electric circuit member;
high friction surface means on said bushing in a first condition of engagement with the housing when said bushing is compressively loaded to said first, lower extent;
said bushing being forcibly movable from exteriorly of the housing axially further in the same sense as the depth of the cavity, against the resilient biasing means for compressively loading the resilient biasing means to a second, greater extent between the bushing and the electric circuit member, and for bringing said high friction surface means to a second condition of engagement with the housing;

the first condition of engagement being one of higher degree wherein the bushing and housing will rotate together if the housing is rotated and the second condition of engagement being one of lesser degree wherein the bushing will not rotate with the housing if the housing is rotated;

the cavity being provided with surface means for contact with the electric circuit member having a lower coefficient of friction with respect thereto than said high friction surface means has with respect to the housing, whereby, when the bushing is forcibly moved biasing the resilient biasing means to said second, greater extent, and the housing is rotated to mount or dismount the housing to or from in the threaded opening, the electric circuit member and its lead wires remain rotationally stationary relative to the bushing.

4. The assembly of claim 3 wherein:

the bushing and resilient biasing means are integrally constituted by a rubber cap having an opening therethrough for sealingly passing the lead wires of the electric circuit member.

5. The assembly of claim 3 wherein the bushing is constituted by a cap having an opening therethrough for sealingly passing the lead wires of the electric circuit member, and the resilient biasing means is constituted by a compression coil spring.

6. An electric circuit member mounting assembly, comprising:

an electric circuit member;

a housing having a cavity opening through an end thereof, the electric circuit member being rotatably received in the cavity;

a housing guide surrounding the housing;

a band of threading extending angularly about the housing guide on the exterior thereof;

means on the housing guide providing for limited forcible contraction of the housing guide when the band is threaded into a threaded opening, sufficient to releasably tighten the housing guide against the housing; and a cap for said end of said cavity, the cap being urgeable into operative engagement with the electric circuit member, for preventing rotation of the electric circuit member as the housing guide is threaded into and out of the threaded opening.

7. The electric circuit member mounting assembly of claim 6, wherein:

the means on the housing guide providing for limited forcible contraction of the housing guide comprises a slot longitudinally broaching said band of threading.

8. A mounting assembly for an electric circuit member which comprises:

an electric circuit member having lead wires extending therefrom;

a housing receiving therein the electric circuit member, and being freely rotatable with respect thereto;

a threaded portion exteriorly provided on the housing for threadably mounting the assembly to an article with which the circuit member is to be applied;

biasing means interposed between said electric circuit member and said housing and comprising rigid cap means adapted to hold said lead wires and spring means interposed between said cap means and said electric circuit member, whereby said housing is allowed to freely rotate relative to said electric circuit member by urging said cap against said electric circuit member which in turn is prevented from being rotated in correspondence with the turning of said housing during mounting or dismounting of the mounting assembly with respect to the article.

9. A mounting assembly for an electric circuit member which comprises:

an electric circuit member having lead wires extending therefrom;

a housing receiving therein said electric circuit member, and being freely rotatable with respect thereto in a released condition;

a first shouldered portion provided on an end of the housing at the outer circumference thereof;

an annular housing guide which receives therein the housing and which is freely rotatable with respect to the housing, the housing guide comprising on the axial end of its inner circumference a second shouldered portion adapted to rotatably engage with said first shouldered portion of the housing so as to prevent escape of the housing from the housing guide;

a threaded portion provided on the outer circumference of the housing guide and adapted to be threadably mounted on a mount for mounting said mounting assembly to an article to which the circuit member is to be applied, whereby mounting and dismounting of said mounting assembly can be performed by simply rotating the housing guide relative to the mount such that said lead wires can be effectively prevented from being twisted during mounting and dismounting.

10. The mounting assembly of claim 9, wherein:

said housing guide further comprises a slit longitudinally extending cut into said portion, whereby tightening between the housing guide and the housing is improved by spring action provided by the slit.

* * * * *